(12) United States Patent
Ogiso

(10) Patent No.: US 12,385,977 B2
(45) Date of Patent: Aug. 12, 2025

(54) VEHICLE MONITORING APPARATUS

(71) Applicant: TOYOTA JIDOSHA KABUSHIKI KAISHA, Toyota (JP)

(72) Inventor: Makoto Ogiso, Mishima (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 164 days.

(21) Appl. No.: 18/238,912

(22) Filed: Aug. 28, 2023

(65) Prior Publication Data

US 2024/0118343 A1   Apr. 11, 2024

(30) Foreign Application Priority Data

Oct. 7, 2022   (JP) .................. 2022-162626

(51) Int. Cl.
*G01R 31/371*   (2019.01)
*B60L 3/00*   (2019.01)
*B60Q 1/50*   (2006.01)
*B60Q 5/00*   (2006.01)
*G01R 31/3842*   (2019.01)

(52) U.S. Cl.
CPC .......... *G01R 31/371* (2019.01); *B60L 3/0046* (2013.01); *B60Q 1/543* (2022.05); *B60Q 5/005* (2013.01); *G01R 31/3842* (2019.01)

(58) Field of Classification Search
None
See application file for complete search history.

(56) References Cited

U.S. PATENT DOCUMENTS

| | | | |
|---|---|---|---|
| 2020/0225288 A1* | 7/2020 | Park | G01R 31/367 |
| 2023/0205294 A1* | 6/2023 | Park | G01R 31/40 |
| 2023/0347777 A1* | 11/2023 | Shpati | B60Q 1/50 |
| 2024/0007529 A1* | 1/2024 | Araujo | B60L 53/68 |

FOREIGN PATENT DOCUMENTS

JP   2014-075906 A   4/2014

* cited by examiner

*Primary Examiner* — Jas A Sanghera
(74) *Attorney, Agent, or Firm* — Oliff PLC

(57) ABSTRACT

A vehicle monitoring apparatus provided in an electric vehicle equipped with a battery includes: a monitoring unit configured to monitor a state of a battery while the electric vehicle is stopped; and a transmission unit configured to transmit information indicating that the battery is in an abnormal state to an outside of the electric vehicle when the monitoring unit determines that the state of the battery is an abnormal state.

6 Claims, 1 Drawing Sheet

VEHICLE MONITORING APPARATUS

The present application claims priority to and incorporates by reference the entire contents of Japanese Patent Application No. 2022-162626 filed in Japan on Oct. 7, 2022.

BACKGROUND

The present disclosure relates to a vehicle monitoring apparatus.

JP 2014-075906 discloses a power storage device disposed inside a building and forcibly discharging the power of the power storage device when receiving a fire detection signal indicating that the fire alarm of the building is activated.

SUMMARY

Incidentally, a battery is also mounted on an electric vehicle. Then, in a case of transporting a large amount of electric vehicles in a large ship or the like, a state in which a plurality of electric vehicles are crowding will continue for a long time. Under such circumstances, it is desirable to detect abnormality of the battery promptly in order to prevent a fire or damage due to combustion of the battery.

There is a need for a vehicle monitoring apparatus capable of quickly detecting abnormality of a battery mounted on an electric vehicle.

According to one aspect of the present disclosure, there is provided a vehicle monitoring apparatus provided in an electric vehicle equipped with a battery, including: a monitoring unit configured to monitor a state of a battery while the electric vehicle is stopped; and a transmission unit configured to transmit information indicating that the battery is in an abnormal state to an outside of the electric vehicle when the monitoring unit determines that the state of the battery is an abnormal state.

DETAILED DESCRIPTION

Hereinafter, a vehicle monitoring apparatus according to an embodiment of the disclosure will be described with reference to the drawings. Note that the disclosure is not limited to the embodiments described below.

Figure 1:
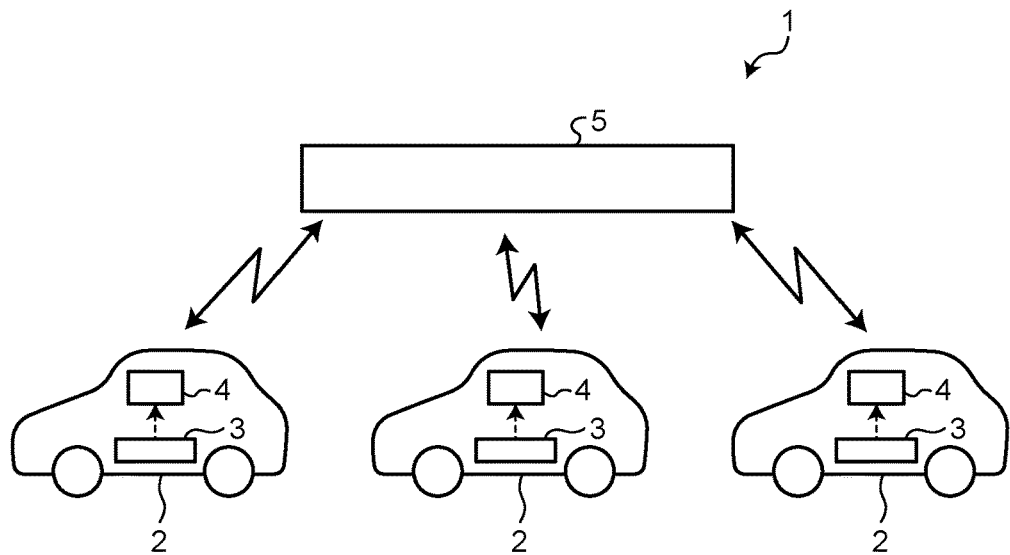
FIG. 1 is a diagram for explaining a monitoring system according to an embodiment.

FIG. 1 is a diagram for explaining a monitoring system according to the embodiment. A monitoring system 1 monitors states of batteries 3 mounted on electric vehicles 2 when transporting the large number of the electric vehicles 2 in a ship or the like.

Each of the electric vehicles 2 includes a motor for traveling, and the battery 3 for storing power supplied to the motor. For example, the electric vehicle 2 is a battery electric vehicle (BEV) and a hybrid electric vehicle (HEV) and a plug-in hybrid electric vehicle (PHEV).

Further, the electric vehicle 2 includes a vehicle monitoring apparatus (hereinafter, simply referred to as a monitoring device) 4. The monitoring device 4 is an electronic controller configured to monitor the state of the battery 3. A signal from a sensor configured to detect the state of the battery 3 is input to the monitoring device 4. For example, a signal of a temperature sensor configured to detect a temperature of the battery 3, a signal from a voltage sensor configured to detect a voltage of the battery 3, a signal from a current sensor configured to detect an electric current of the battery 3, and the like are input to the monitoring device 4. Then, the monitoring device 4 executes the monitoring control for monitoring the battery 3 based on the input signals from the various sensors. The monitoring control is a control for monitoring the temperature and the charging state of the battery 3.

Furthermore, the electric vehicle 2 includes a communication device such as a DCM. A management device 5 is installed outside the electric vehicle 2. The electric vehicle 2 is capable of radio communication with the managing device 5 using a DCM or the like. The monitoring device 4 is configured to be able to provide the vehicle information held by the electric vehicle 2 side to the management apparatus 5. The vehicle information includes positional information of the electric vehicle 2 and the battery information indicating the state of the battery 3. For example, the battery information includes SOC of the battery 3, the temperature of the battery 3, the electric current value of the battery 3, the temperature of the cooling water for cooling the battery 3, and the like. Then, the monitoring device 4 is provided with a permission condition for permitting information communication in advance such as during transportation of the electric vehicle 2. When the permission condition is satisfied, the monitoring device 4 provides the vehicle information that the electric vehicle 2 side holds to the management device 5.

Specifically, the monitoring device 4 includes a monitoring unit, a transmitting unit, and a providing unit.

The monitoring unit monitors the state of the battery 3 under a situation in which the electric vehicle 2 is stopped. For example the monitoring unit monitors the state of the battery 3 when it is set to the monitoring mode. The monitoring mode is set when the electric vehicle 2 is being transported together with the other electric vehicles 2. That is, the monitoring mode includes a vehicle transport mode.

The vehicle transport mode is validated until arrival from factory to dealer. The vehicle transport mode is set to valid from factory shipment to a user. Assuming the transport of used cars, the vehicle transport mode may also be set effectively at the time of contract between a reseller and a manufacturer.

In the transport mode, monitoring of the risk of combustion is also carried out if ignition of the motor vehicle 2 is in the off-state. In other words, the monitoring mode is a mode for monitoring the state of the battery 3 when the ignition is turned off. The monitoring unit monitors the state of the battery 3 for each period that may lead to the combustion of the battery 3. The objects to be monitored are the temperature of the battery 3, the ambient temperature of the battery 3, the electric current of the battery 3, the electric current of each part, and the like. The monitoring unit measures the temperature and the electric current at each predetermined interval, to correct the monitoring frequency based on the difference between the latest current measurement value and the previous measurement value (a change amount).

Further, the monitoring unit determines whether or not the risk of the combustion of the battery 3 is expected. Then, the monitoring unit determines that the state of the battery 3 is an abnormal state when the risk of the combustion of the battery 3 is expected.

When the monitoring unit determines that the state of the battery 3 is in an abnormal state, the transmitting unit transmits the information indicating that the battery 3 is in an abnormal state to the outside of the electric vehicle 2. For example, the transmitter unit notifies the outside of information indicating that the battery 3 is in an abnormal state by sounding of the horn of the electric vehicle 2 or blinking of the lamp. The flashing of the lamp includes passing and the flashing of the hazard lamp. Further, the transmitting unit transmits information indicating that the battery 3 is in an abnormal state to the management device 5 by using a communication device such as a DCM or other short-distance communication or telecommunication devices.

The providing unit provides the vehicle information to the external device when there is a request for acquiring the vehicle information indicating the state of the electric vehicle 2 from the external device after the information indicating that the state of the battery 3 is in an abnormal state is transmitted to the outside by the transmitting unit. For example, at any timing, a vehicle transporter may obtain a monitored value for each of the electric vehicles 2 using the management device 5. In this case, the management apparatus 5 and the electric vehicle 2 may be wired communication in a state of being connected by a wire. Thus the electric vehicle 2 receives the acquisition request of the vehicle information from the external device such as the management apparatus 5.

Figure 2:
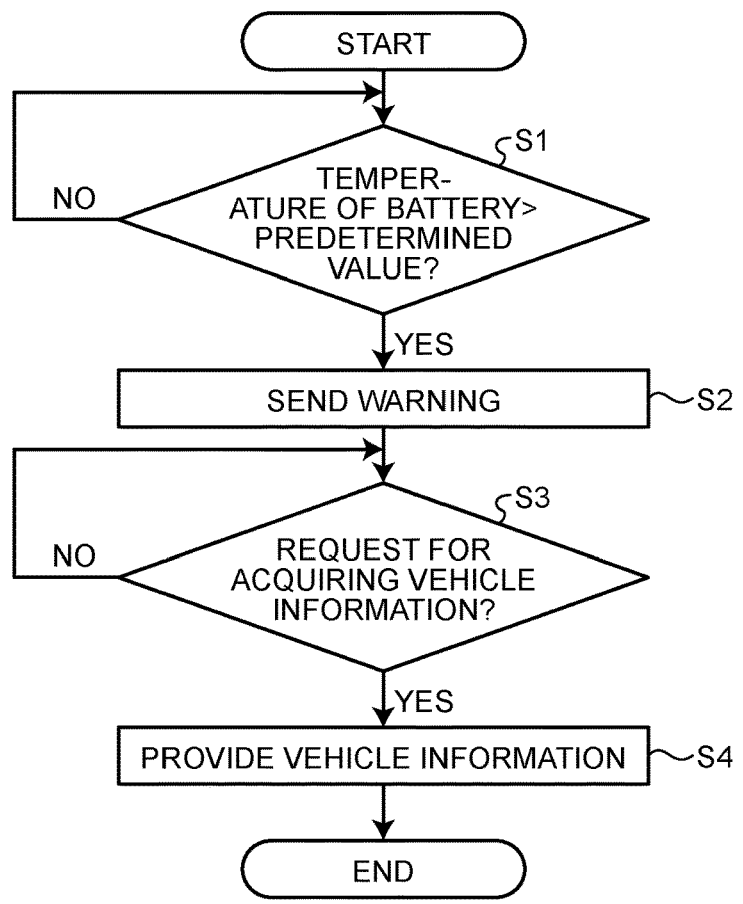
FIG. 2 is a flowchart illustrating a monitoring control flow.

FIG. 2 is a flowchart illustrating a monitoring control flow. Incidentally, the control shown in FIG. 2 is implemented by the monitoring device 4 during the monitoring mode.

The monitoring device 4 determines whether the temperature of the battery 3 is higher than a predetermined value (Step S1). The predetermined value is a preset threshold value. In Step S1, it is determined whether or not an abnormal temperature-rise has occurred in the battery 3 while the electric vehicle 2 is stopped.

If the cell 3 is determined to be below a predetermined value (Step S1: No), the control routine returns to Step S1.

If the temperature of the battery 3 is determined to be higher than the predetermined value (Step S1: Yes), the monitoring device 4 sends a warning toward the outside of the electric vehicle 2 (Step S2). In Step S2, since the state of the battery 3 is determined to be an abnormal state, information indicating that the battery 3 is in an abnormal state (warning) is transmitted toward the outside of the electric vehicle 2. The alert includes sounding the horn of the electric vehicle 2, blinking the hazard lamp of the electric vehicle 2, and wireless communication with the management device 5. For example, the monitoring device 4 sounds the horn and flashes a hazard lamp.

After transmitting the warning toward the outside of the electric vehicle 2, the monitoring device 4 determines whether there is a request to acquire the vehicle information from the external device (Step S3). In Step S3, it is determined whether or not a request for acquiring the vehicle information from the managing device 5 has been received.

If it is determined that there is no need to obtain vehicle-information (Step S3: No), the control routine returns to the step S3.

If it is determined that there is a request to acquire the vehicle information (Step S3: Yes), the monitoring device 4 provides the vehicle information indicating the state of the electric vehicle 2 to the external device (Step S4). In Step S4, vehicle information is provided to the managing device 5. Performing the process of Step S4, this control routine ends.

As described above, according to the embodiment, it is possible to quickly grasp the occurrence of abnormality of the battery 3 based on the caution transmitted toward the outside of the electric vehicle 2. Then, since it becomes possible to perform appropriate countermeasures, it is possible to avoid combustion and fire occurrence of the battery 3. Thus, it is possible to minimize damage to the battery 3 and the electric vehicle 2.

Further, under the situation where there are a plurality of electric vehicles 2, it is possible to obtain the information of the electric vehicle 2 to be managed from the entire at the necessary timing.

Incidentally, the vehicle transport mode may include a control mode for controlling the state of the battery 3. For example, the monitoring device 4 performs control to increase the power dissipation such that SOC of the batteries 3 is within the target during vehicle transit. The monitoring device 4 prioritizes safety over efficiency in terms of temperature control of the battery 3. That is, the target value of the temperature control is shifted to the low temperature side.

Also, the monitoring mode can be interlocked with the transport management system. For example, when transporting by ship, the monitoring mode is linked with the transportation management system. When a carrier car is used for transportation, the monitoring mode and the transportation control system are linked when the number of loaded cars is large. Monitoring of the battery 3 is started at the time when the electric vehicle 2 is loaded in both the ship transportation and the carrier car transportation. It may have a function of notifying the vehicle information before transportation from the electric vehicle 2 side to the transportation management system side.

In addition, the permission condition for allowing the information communication in advance includes a worker who performs the transportation work of the electric vehicle 2, a transporter, and the owner of the electric vehicle 2. Storage of the electric vehicle 2 includes a storage contractor and a parking lot operating company.

According to the disclosure, it is possible to quickly grasp the occurrence of abnormality of the battery mounted on the electric vehicle.

Specifically, according to the disclosure, the vehicle monitoring apparatus monitors the state of the battery under a situation in which the electric vehicle is stopped, and transmits the information to the outside when an abnormality occurs, so that it is possible to quickly grasp the abnormality of the battery from the outside.

Moreover, according to the disclosure, for example, it is possible to set the monitoring mode when transporting a large amount of electric vehicle in a ship or the like. Thus, it is possible to quickly grasp from the outside the abnormality of the battery during transportation of a large amount of electric vehicles.

Further, according to the disclosure, by notifying the outside of the abnormality of the battery by the sounding of the horn or the flashing of the lamp, under the situation in which there are a plurality of electric vehicles, it is easy to identify from the outside whether the abnormality has occurred in which electric vehicle.

Furthermore, according to the disclosure, it is possible to provide information for identifying the cause of the abnormality of the battery occurs to the external device depending on necessity.

Although the disclosure has been described with respect to the specific embodiment for a complete and clear disclosure, the appended claims are not to be thus limited but are to be construed as embodying all modifications and alternative constructions that may occur to one skilled in the art that fairly fall within the basic teaching herein set forth.

What is claimed is:

1. A vehicle monitoring apparatus provided in an electric vehicle equipped with a battery, the vehicle monitoring apparatus comprising:
    a monitoring unit configured to monitor a state of the battery of the electric vehicle while an ignition switch of the electric vehicle is in an OFF-state; and
    a transmitting unit configured to transmit information indicating that the battery is in an abnormal state to an outside of the electric vehicle when the monitoring unit determines that the state of the battery is the abnormal state,
wherein the monitoring unit:
    monitors (i) a temperature of the battery, (ii) an ambient temperature of the battery, and (iii) an electric current of the battery,
    measures (a) the temperature of the battery and (b) the electric current of the battery, at predetermined intervals, to correct a monitoring frequency of the battery based on a difference between a latest measurement value and a previous measurement value of the temperature of the battery and the electric current of the battery,
    determines that there is a risk of combustion of the battery by comparing the temperature of the battery that has been measured with a threshold value, and
    determines that the state of the battery is the abnormal state when it has been determined that there is the risk of combustion of the battery.

2. The vehicle monitoring apparatus according to claim 1, wherein
    the monitoring unit is configured to monitor the state of the battery in a monitoring mode, and
    the monitoring mode is set when the electric vehicle is being transported together with other plurality of electric vehicles.

3. The vehicle monitoring apparatus according to claim 2, wherein the transmitting unit is configured to notify the information indicating the abnormal state to the outside by sounding of a horn of the electric vehicle or flashing of a lamp of the electric vehicle.

4. The vehicle monitoring apparatus according to claim 1, further comprising
    a providing unit configured to provide vehicle information indicating a state of the electric vehicle to an external device in response to a request for acquiring the vehicle information from the external device after the information indicating the abnormal state is transmitted to the outside by the transmitting unit.

5. The vehicle monitoring apparatus according to claim 2, further comprising
    a providing unit configured to provide vehicle information indicating a state of the electric vehicle to an external device in response to a request for acquiring the vehicle information from the external device after the information indicating the abnormal state is transmitted to the outside by the transmitting unit.

6. The vehicle monitoring apparatus according to claim 3, further comprising
    a providing unit configured to provide vehicle information indicating a state of the electric vehicle to an external device in response to a request for acquiring the vehicle information from the external device after the information indicating the abnormal state is transmitted to the outside by the transmitting unit.

* * * * *